United States Patent
O'Rourke et al.

(10) Patent No.: US 8,966,917 B2
(45) Date of Patent: Mar. 3, 2015

(54) COOLING SYSTEMS WITH DEAERATION RESERVOIRS

(75) Inventors: David B. O'Rourke, Shelby Township, MI (US); Christopher C. Nyeholt, Armada, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 1131 days.

(21) Appl. No.: 12/907,668

(22) Filed: Oct. 19, 2010

(65) Prior Publication Data

US 2012/0090348 A1  Apr. 19, 2012

(51) Int. Cl.
| | | |
|---|---|---|
| *F25B 43/04* | (2006.01) | |
| *H01M 8/24* | (2006.01) | |
| *B60H 1/00* | (2006.01) | |
| *H01M 10/613* | (2014.01) | |
| *H01M 10/625* | (2014.01) | |
| *H01M 10/6565* | (2014.01) | |
| *B60K 1/00* | (2006.01) | |

(52) U.S. Cl.
CPC ......... *H01M 8/2465* (2013.01); *B60H 1/00278* (2013.01); *H01M 10/5004* (2013.01); *H01M 10/5016* (2013.01); *H01M 10/5071* (2013.01); *B60K 2001/005* (2013.01); *Y02E 60/50* (2013.01)
USPC ............................. 62/174; 62/503; 123/41.54

(58) Field of Classification Search
USPC .............. 62/174, 503; 123/41.54; 165/104.32
See application file for complete search history.

(56) References Cited

U.S. PATENT DOCUMENTS

| | | | |
|---|---|---|---|
| 3,195,294 A | | 7/1965 | Verdura et al. |
| 4,273,563 A | * | 6/1981 | Fadda et al. ..................... 96/209 |
| 6,708,653 B2 | * | 3/2004 | Lefran.cedilla.ois et al. ........................ 123/41.54 |
| 7,631,619 B2 | * | 12/2009 | Bangert et al. ............. 123/41.54 |
| 2002/0157621 A1 | | 10/2002 | Lefrancois et al. |
| 2005/0081716 A1 | | 4/2005 | Morita et al. |
| 2008/0173362 A1 | | 7/2008 | Wong et al. |
| 2010/0089913 A1 | * | 4/2010 | Dexter et al. ................. 220/4.12 |

FOREIGN PATENT DOCUMENTS

| | | |
|---|---|---|
| CN | 100335760 C | 9/2007 |
| CN | 201228678 Y | 4/2009 |
| DE | 2848846 A1 | 5/1979 |
| DE | 10300294 A1 | 7/2003 |
| JP | H10314503 A | 12/1998 |

OTHER PUBLICATIONS

State Intellectual Property Office of the People'S Republic of China, Office Action for Chinese Patent Application No. 201110318220.5, mailed Dec. 4, 2013.
The German Patent and Trade Mark Office, Office Action for German Patent Application No. 10 2011 084 263.2, mailed Jun. 16, 2014.
State Intellectual Property Office of the Peoples' Republic of China, Office Action for Chinese Patent Application No. 201110318220.5, mailed Jul. 16, 2014.

* cited by examiner

*Primary Examiner* — Cassey D Bauer
(74) *Attorney, Agent, or Firm* — Ingrassia Fisher & Lorenz, P.C.

(57) ABSTRACT

A coolant reservoir includes a body portion defining an interior cavity configured to hold a coolant; and a barrier wall positioned within the body portion to partition the interior cavity into an upper chamber and a lower chamber, the barrier wall defining an opening therethrough that allows fluid communication between the lower chamber and the upper chamber.

13 Claims, 4 Drawing Sheets

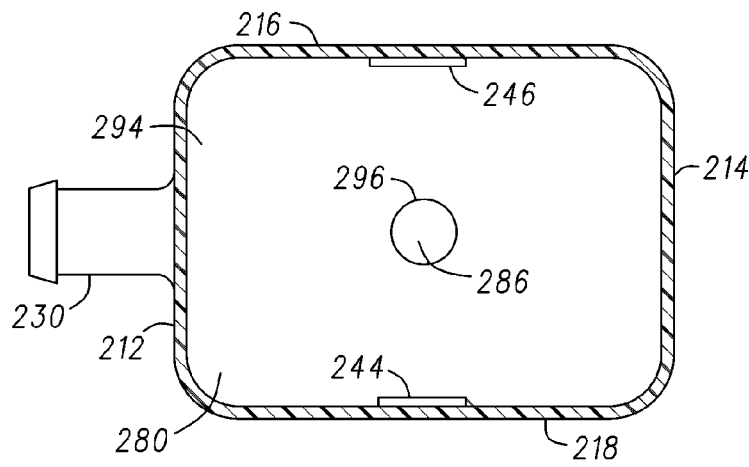
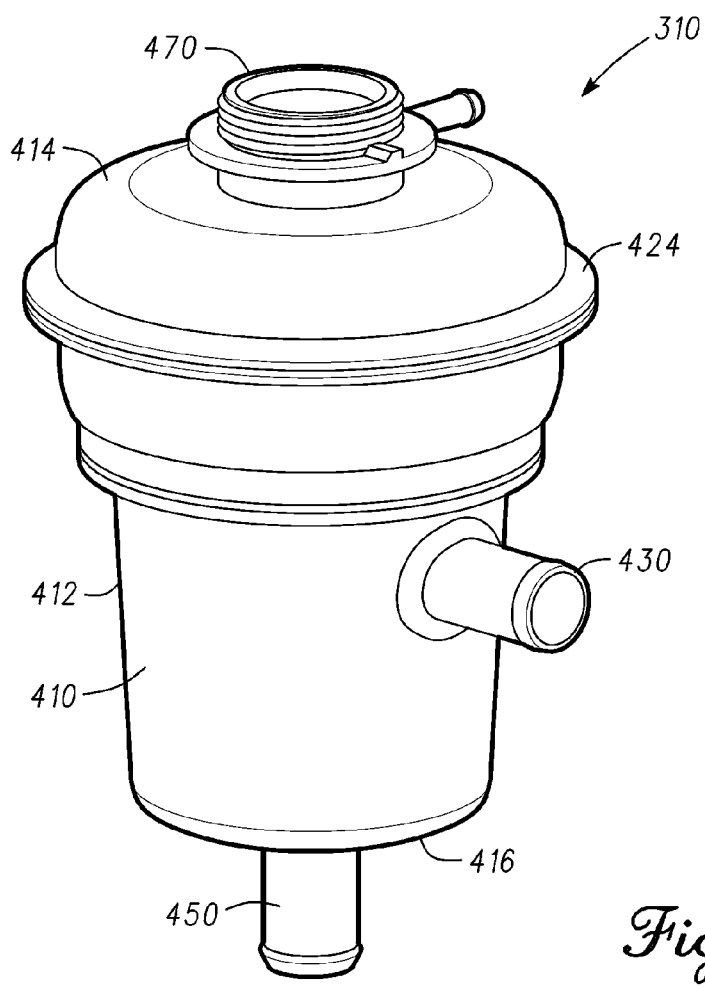
Fig. 4
Fig. 5

COOLING SYSTEMS WITH DEAERATION RESERVOIRS

TECHNICAL FIELD

The present invention generally relates to cooling systems, and more particularly relates to reservoirs for cooling systems of the type used to cool vehicle electronics, such as those associated with hybrid and fuel cell motor vehicles.

BACKGROUND

Some modern automotive vehicles are propelled by electric motors, such as, for example, fuel cell vehicles, hybrid electric vehicles, or pure electric vehicles. These vehicles typically include battery modules and other electronic components used to drive the motor. A significant amount of energy may flow into and out of the electronic components, which results in the generation of heat. As a result, various cooling techniques have been developed to dissipate heat. Given the stringent performance and weight requirements of these vehicles, it is desirable to provide cooling in the most efficient and least costly way possible. Typically, these cooling systems may include a closed loop that circulates coolant through the battery module and other electronic components to remove heat from, and thus cool, these components and then through a heat exchanger to remove the heat from the coolant.

As the temperature of the coolant within the cooling system increases and decreases during and after operation, the volume of the coolant respectively increases and decreases. To accommodate volume variations, coolant reservoirs may be integrated with the closed loop cooling system to capture and store reserve (or excess) coolant as the coolant temperature increases and then later return the reserve coolant to the cooling system as the coolant temperature drops.

In addition to coolant, some air is contained within the coolant reservoir to accommodate coolant volume changes. Moreover, air may be introduced into the system during filling or service operations of the cooling system. In some cases, this air may become entrained within the coolant (i.e., aerated) of the cooling system. The entrained air in the coolant may reduce cooling system efficiency.

Accordingly, it is desirable to provide improved cooling systems for efficiently cooling components of electric motor vehicles. In addition, it is desirable to provide cooling systems that deaerate the coolant without adding undue weight or cost to the vehicle. Furthermore, other desirable features and characteristics of the present invention will become apparent from the subsequent detailed description of the invention and the appended claims, taken in conjunction with the accompanying drawings and this background of the invention.

BRIEF SUMMARY

In accordance with an exemplary embodiment, a coolant reservoir includes a body portion defining an interior cavity configured to hold a coolant; and a barrier wall positioned within the body portion to partition the interior cavity into an upper chamber and a lower chamber, the barrier wall defining an opening therethrough that allows fluid communication between the lower chamber and the upper chamber.

In accordance with an exemplary embodiment, a cooling system for cooling a vehicle component with a coolant is provided. The system includes a pump configured to direct the coolant to the vehicle component such that heat transfers from the vehicle component to the coolant; a heat exchanger fluidly coupled to the pump to remove heat from the coolant; and a coolant reservoir fluidly coupled to the heat exchanger and the pump, the coolant reservoir configured to receive a mixture of the coolant and entrained air, to store a first portion of the coolant as system coolant and a second portion of the coolant as reserve coolant, and to separate the entrained air from the system coolant.

BRIEF DESCRIPTION OF THE DRAWINGS

The present invention will hereinafter be described in conjunction with the following drawing figures, wherein like numerals denote like elements, and wherein

FIG. 4 is a cross-sectional view of the coolant reservoir of FIG. 3 along line 4-4;

FIG. 5 is an isometric view of a coolant reservoir of the cooling system of FIG. 1 in accordance with an alternate exemplary embodiment.

DETAILED DESCRIPTION

The following detailed description is merely exemplary in nature and is not intended to limit the invention or the application and uses of the invention. Furthermore, there is no intention to be bound by any theory presented in the preceding background or the following detailed description.

Broadly, exemplary embodiments described herein relate to a cooling system that circulates a coolant to remove heat from battery modules and other electronic components of electric motor vehicles. The cooling system may include a coolant reservoir for storing reserve coolant and deaerating the coolant circulating within the cooling system. In one exemplary embodiment, the coolant reservoir includes upper and lower chambers that are separated by a barrier wall. When receiving aerated coolant in the lower chamber, the air may rise through a hole in the barrier wall and collect in the upper chamber. The barrier wall prevents the air in the upper chamber from mixing with the coolant in the lower chamber, thereby preventing the air from reentering the cooling circuit and reaching the other components of the cooling system.

Figure 1:
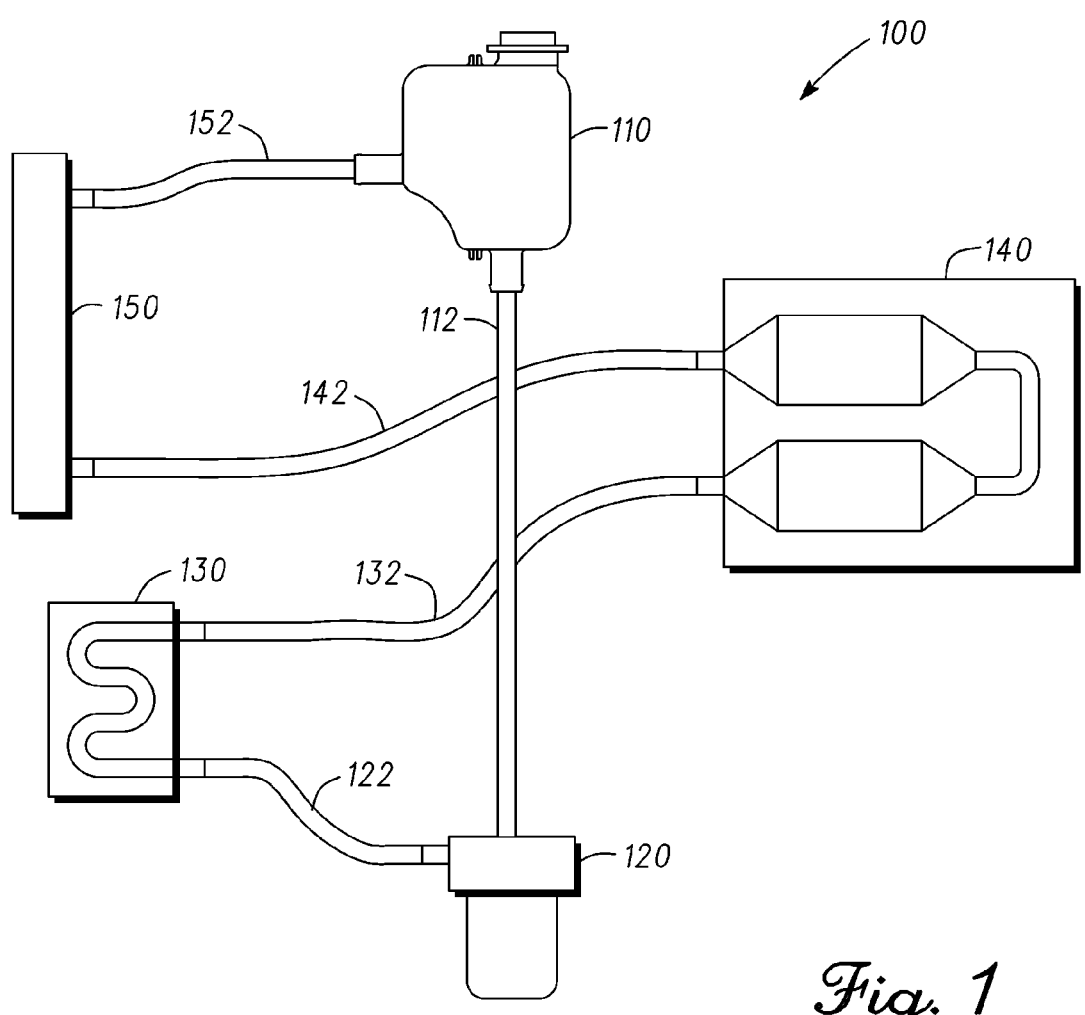
FIG. 1 is a schematic representation of a cooling system in accordance with an exemplary embodiment.

FIG. 1 is a schematic representation of a cooling system 100 in accordance with an exemplary embodiment. Although not shown, the cooling system 100 may be incorporated into a motor vehicle or any other type of system that requires cooling. Motor vehicle applications of the cooling system 100 include, for example, hybrid motor vehicles and fuel cell motor vehicles. Hybrid motor and fuel cell vehicles utilize electrical components that supplement or replace the internal combustion engines, including electric drive motors, batteries, power inverters, and other electronic components. Problematically, the components of these vehicles, such as those discussed below, generate heat that should be removed to maintain operation. As such, the cooling system 100 may be incorporated into such vehicles to dissipate the generated heat.

In the exemplary embodiment of FIG. 1, the cooling system 100 is a closed-loop cooling circuit with a coolant reservoir 110, a pump 120, fluid passages in a battery charging module 130, fluid passages in a power electronics module 140, and a heat exchanger 150. Coolant is stored in the coolant reservoir 110 and is circulated through the cooling system 100 by the pump 120. Specifically, coolant flows from the coolant reservoir 110 through a first conduit 112 to the pump 120. The pump 120 may be any suitable type, such as, for example, a crescent pump, an impeller pump, a gear pump, or a vane pump. After flowing through the pump 120, the coolant is directed through a second conduit 122 to the battery charging module 130. While flowing through passages in the battery charging module 130, the coolant conductively absorbs heat from, and thus cools, the battery charging module 130. The coolant then flows to fluid passages in the power electronics module 140 via a third conduit 132. As before, the coolant cools the power electronics module 140 by absorbing heat from the components in the power electronics module 140, which may include for example an inverter. The coolant flows from the power electronics module 140, through a fourth conduit 142, and to the heat exchanger 150. The heat exchanger 150 may be, for example, a radiator in which air flowing through the radiator absorbs heat from the coolant and dissipates the heat to the atmosphere. The coolant then returns to the coolant reservoir 110 through a fifth conduit 152, and the circuit is repeated to maintain the temperature of the vehicle at an acceptable level. The coolant reservoir 110 stores reserve coolant to accommodate increases and decreases in coolant volume and provides deaeration of the coolant flowing through the cooling system 100. The coolant reservoir 110 is discussed in greater detail below with reference to FIGS. 2-4.

The coolant may be a common coolant such as that typically used in an internal combustion engine or generally may be any type of liquid coolant with suitable heat transfer properties. In one exemplary embodiment, the coolant may be a water and ethylene glycol mix or deionized water. In another embodiment, the coolant may include other compositions, including certain high molecular weight hydrocarbons, (HMWHs), silicone oils, and natural and synthetic esters. In general, typical selected coolants have low volatility and are chemically stable, having minimal reactivity in the presence of oxygen at operating temperatures, and are generally non-corrosive to any of the materials that make up the electric motor.

Although FIG. 1 illustrates one exemplary cooling system 100, other exemplary embodiments may include additional or fewer components or may rearrange the depicted components as necessary or desired. Such additional components may include, without limitation, fan assemblies, thermostats, controllers, pressure relief valves, condensers, chillers, coolers, filters, and sumps. Additionally, the cooling system 100 may cool portions of the vehicle other than those depicted, such as motors, batteries, accessory power supplies, alternators, engine turbo/super chargers, intercoolers, oil coolers, transmission, and the like. Generally, the cooling system 100 discussed herein does not require any bypass conduits or portions to cool the battery charging module 130 and/or power electronics module 140, although such arrangements may be provided.

Figure 2:
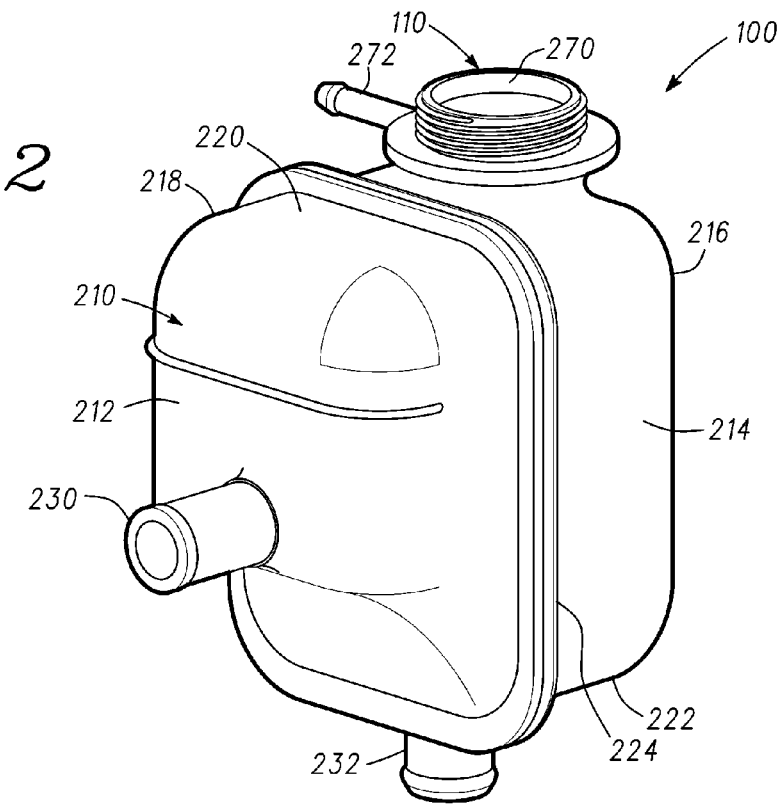
FIG. 2 is an isometric view of a coolant reservoir of the cooling system of FIG. 1 in accordance with an exemplary embodiment.

FIG. 2 is an isometric view of the coolant reservoir 110 of the cooling system 100 of FIG. 1 in accordance with an exemplary embodiment. As noted above, the coolant reservoir 110 functions as both a reservoir and a deaeration tank for the cooling system 100. During operation, the coolant increases and decreases in temperature, and thus, increases and decreases in volume. As a result, the closed-loop cooling system 100 generally includes some amount of space, which contains air, to accommodate the volume increases without undue pressure increases. As described in further detail below, this air typically collects in the coolant reservoir 110. It is generally advantageous if the air does not mix with the coolant and circulate to the other portions of the cooling system 100. Air may function to insulate the components to be cooled, such as the battery charging module 130 (FIG. 1) and the power electronics module 140 (FIG. 1), by preventing coolant from reaching the desired portions. The presence of air may also result in inefficiencies in the performance of the pump 120 (FIG. 1), including the potential loss of prime.

In addition to air within the space of the coolant reservoir 110 that accommodates volume changes, air may also be introduced into the cooling system 100 during service in which the coolant is drained out of the cooling circuit, leaving only air. After service, the coolant in the cooling system 100 is replaced by refilling the cooling system 100. However, it is difficult to remove all of the air within the cooling system 100 during the refilling operation, and as a result, some of the air remains at various locations within the cooling system 100, including locations that are outside of the coolant reservoir 110, which if not addressed, may result in the undesirable issues discussed above. As described in greater detail below, as the cooling system 100 operates, the coolant reservoir 110 functions to deaerate the coolant as the coolant flows through the coolant reservoir 110 such that air is collected in the coolant reservoir 110 instead of continuing to circulate through the cooling system 100.

As shown in FIG. 2, the coolant reservoir 110 includes a body portion 210 that defines an interior cavity (not shown in FIG. 2). In the exemplary embodiment of FIG. 2, the body portion 210 is generally box-shaped with four side walls 212, 214, 216, and 218, a top wall 220, and a bottom wall 222. In general, the body portion 210 may define any shape suitable for the functions described herein, and some consideration for manufacturing and/or positioning the coolant reservoir 110 within the engine compartment may be provided. A flange 224 may extend around the body portion 210 to assist in mounting the coolant reservoir 110 within the engine compartment. Typically, the coolant reservoir 110 may be manufactured using an easily molded and lightweight material such as any of a variety of known plastics, although any suitable material may be used.

The coolant reservoir 110 includes a system inlet 230 that is configured to be coupled to the fifth conduit 152 (FIG. 1) for receiving coolant from the power electronics module 140 (FIG. 1). In the depicted embodiment, the system inlet 230 is horizontally positioned as a tube or conduit on the first side wall 212, although other configurations are possible. The coolant reservoir 110 further includes a system outlet 250 that is configured to be coupled to the first conduit 112 (FIG. 1) for providing coolant to the pump 120 (FIG. 1). In the depicted embodiment, the system outlet 250 is vertically positioned as a tube or conduit on the bottom wall 222, although other configurations are possible. A fill inlet 270 may also be provided on the top wall 220. In the depicted embodiment, the fill inlet 270 has a threaded neck defining an open mouth that is typically closed by a cap (not shown) that may be removed to provide additional coolant to the cooling system 100, such as refilling during service. The fill inlet 270 may further include a pressure release device 272 that functions to vent fluid out of the coolant reservoir 110 when the coolant in the system 100 reaches a predetermined pressure.

Figure 3:
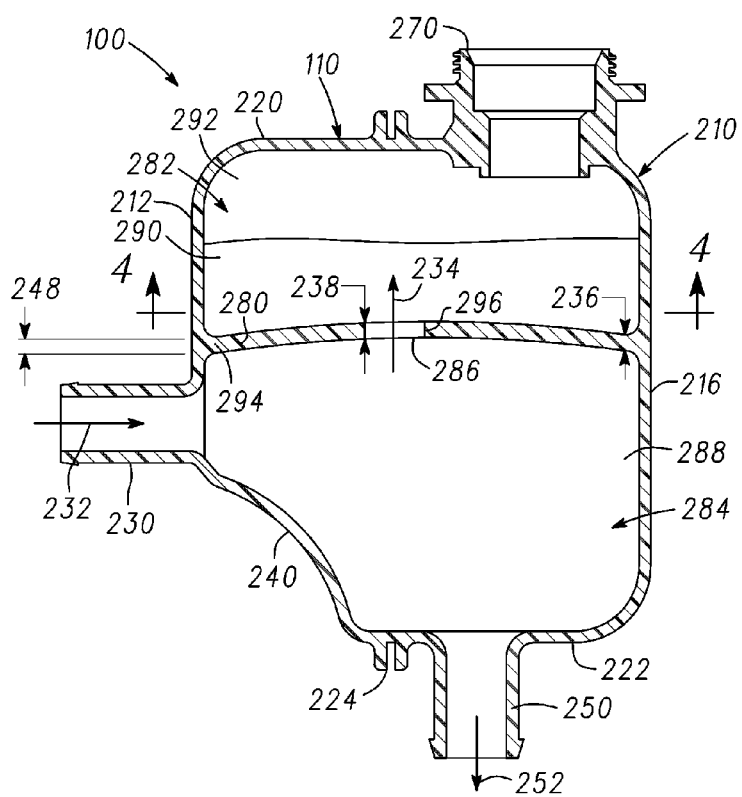
FIG. 3 is a cross-sectional view of the coolant reservoir of FIG. 2.

FIG. 3 is a cross-sectional view of the coolant reservoir 110 of FIG. 2, and FIG. 4 is a cross-sectional view of the coolant reservoir of FIG. 3 along line 4-4. As such, FIGS. 3 and 4 will be discussed together. As discussed above, the body portion 210 is formed by side walls 212 and 214, top wall 220, and bottom wall 222 and defines an interior cavity 226. Coolant from the cooling system 100 enters the coolant reservoir 110 through the system inlet 230, as indicated by arrow 232, and exits the coolant reservoir 110 through system outlet 250, as indicated by arrow 252. Coolant may also be introduced into the coolant reservoir 110 through the fill inlet 270, particularly during the initial charging of the cooling system 100 or during service.

As shown in FIGS. 3 and 4, the coolant reservoir 110 further includes a barrier wall 280 that subdivides or partitions the interior cavity 226 into an upper chamber 282 and a lower chamber 284. The barrier wall 280 defines a barrier opening 286 that allows fluid communication between the upper chamber 282 and the lower chamber 284. As best shown in FIG. 4, the barrier opening 286 is located approximately in a central position on the barrier wall 280 and may be circular, although other shapes and positions may be provided. As best shown in FIG. 4, the barrier wall 280 may also define one or more barrier slits 244 and 246 positioned on the side walls 216 and 218. The barrier slits 244 and 246 may be rectangular, although other shapes and positions may be provided.

The barrier wall 280 may be tapered. Specifically, the barrier wall 280 may have an outer edge 294, such as the edge attached to the side walls 212 and 214 in FIG. 3, and an inner edge 296 that defines the barrier opening 286. The thickness 236 of the outer edge 294 may be greater than the thickness 238 of the inner edge 296. The barrier wall 280 may also be domed-shaped within the coolant reservoir 110, as best shown by FIG. 3. Particularly, the outer edges 294 may be disposed below the inner edge 296 by a predetermined distance, such as distance 248 in FIG. 3.

Coolant may flow from the upper chamber 282 to the lower chamber 284 through the barrier opening 286 and the barrier slits 244 and 246 as the coolant within the cooling system 100 contracts to ensure a sufficient circulating volume for cooling. Similarly, coolant may flow from the lower chamber 284 to the upper chamber 282 during expansion of the coolant to remove excess coolant from the circulating volume.

The system inlet 230 particularly delivers coolant to the lower chamber 284, and the system outlet 250 particularly draws coolant from the lower chamber 284 as the coolant circulates through the cooling system 100. As such, the coolant within the lower chamber 284 may be referred to as system coolant 288. The upper chamber 282 defines a space that enables expansion and contraction of coolant, as well as a space for collecting air within the cooling system 100. As such, the coolant within the upper chamber 282 may be referred to as reserve coolant 290 while the remaining space of the upper chamber 282 generally includes collected air 292. Now that the structure of the coolant reservoir 110 has been described, the deaeration operation of the coolant reservoir 110 will be explained below.

During operation, coolant is received within the lower chamber 284 from the system inlet 230 as system coolant 288. As noted above, air from other components of the cooling system 100 may be entrained with the coolant received at the system inlet 230, and as such, may be mixed with the system coolant 288. When stored within the lower chamber 284, any air mixed with the system coolant 288 may rise to the barrier wall 280 and flow through the barrier opening 286 to the reserve coolant 290. Any air mixed with the system coolant 288 and located along a side wall, such as side walls 216 and 218, may flow into the upper chamber 282 through the barrier slits 244 and 246. Such air generally collects at the top of the coolant reservoir 110 as a portion of the collected air 292, as indicated by arrow 234. Accordingly, entrained air is removed from the system coolant 288 prior to exiting the lower chamber 284 at the system outlet 250. This enables the system outlet 250 to deliver deaerated coolant to the rest of the system 100. After the air is collected in the upper chamber 282, the barrier wall 280 prevents the collected air 292 from being remixed with the system coolant 288, thereby preventing the collected air 292 from reentering the circuit of the cooling system 100. In effect, the barrier wall 280 creates a relatively quiet zone for the reserve coolant 290 in the upper chamber 282, separate from the flowing system coolant 288 in the lower chamber 284.

The barrier wall 280 may be optimized to facilitate the movement of air into the upper chamber 282. For example, as noted above, the tapered nature of the barrier wall 280 encourages the flow of entrained air into the upper chamber 282. Additionally, the dome shape encourages the flow of entrained air into the upper chamber 282. In some embodiments, the barrier slits 244 and 246 may be omitted, and in other embodiments, additional barrier slits may be provided to facilitate the transport of air from the lower chamber 284 to the upper chamber 282.

As also shown in FIG. 3, the side wall 212 may define an interior ramp 240 proximate to the system inlet 230. During periods of low levels of coolant, including atypical conditions at which the coolant falls below the barrier wall 280, the interior ramp 240 improves the deaeration function of the coolant reservoir 110 by delivering the incoming coolant 232 to the system outlet 250 without undue mixing with air in the coolant reservoir 110.

The dimensions of the coolant reservoir 110 may be any suitable dimensions to perform the functions discussed herein. In one exemplary embodiment, the volume of the upper chamber 282 may be approximately equal to the volume of the lower chamber 284. The system inlet 230 is generally positioned just below the barrier wall 280. The barrier opening 286 is sized such that air may rise up through the barrier opening 286 but generally prevents air from flowing back down through the barrier opening 286.

FIG. 5 is an isometric view of a coolant reservoir 310 in accordance with an alternate exemplary embodiment. Similar to the coolant reservoir 110 of FIGS. 2-4, the coolant reservoir 310 includes a body portion 410 that defines an interior cavity (not shown in FIG. 5). In the exemplary embodiment of FIG. 5, the body portion 410 is generally cylindrical with a cylindrical side wall 412, a top wall 414, and a bottom wall 416. In general, the body portion 410 may define any shape suitable for the functions described herein, and some consideration for manufacturing and/or positioning the coolant reservoir 310 within the engine compartment may be provided. One or more flanges 424 may extend around the body portion 410 to assist in mounting the coolant reservoir 310 within the engine compartment.

The coolant reservoir 310 includes a system inlet 430 that is configured to be coupled to the fifth conduit 152 (FIG. 1) for receiving coolant from the power electronics module 140 (FIG. 1). In the depicted embodiment, the system inlet 430 is horizontally positioned on the side wall 412, although other configurations are possible. The coolant reservoir 310 further includes a system outlet 450 that is configured to be coupled to the first conduit 112 (FIG. 1) for providing coolant to the power pump 120 (FIG. 1). In the depicted embodiment, the system outlet 450 is vertically positioned on the bottom wall 422, although other configurations are possible. A fill inlet 470 may also be provided on the top wall 420. The fill inlet 470 is typically closed by a cap (not shown) that may be removed to provide additional coolant to the cooling system 100, such as during service.

Figure 6:
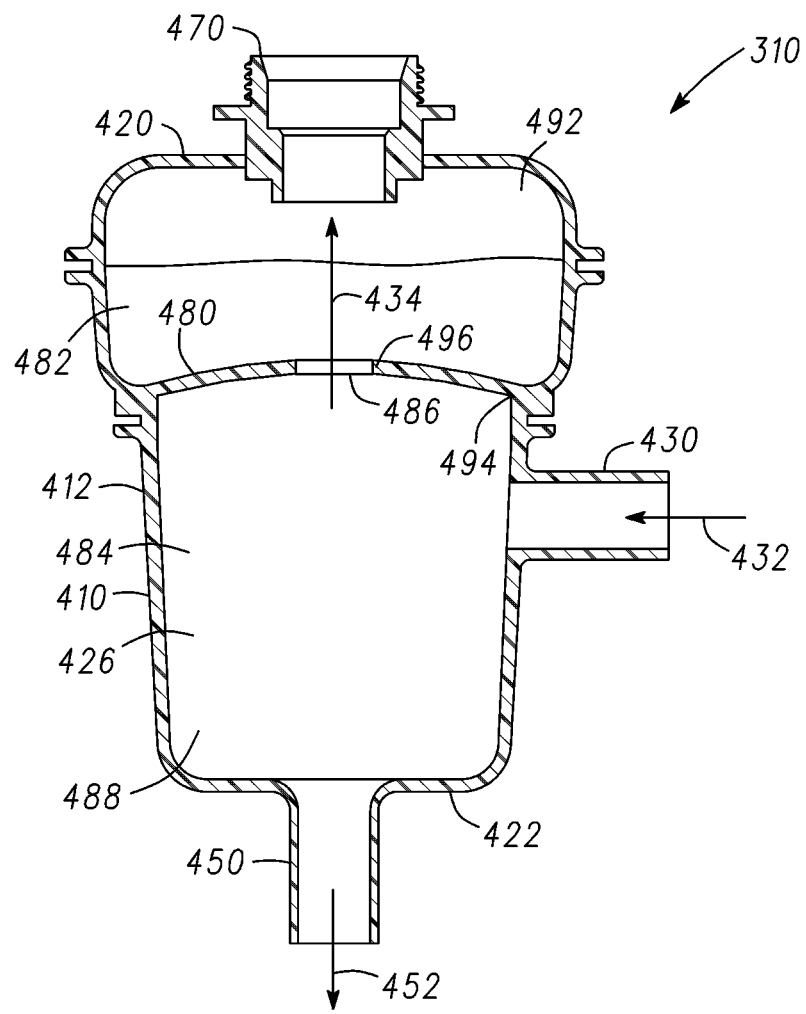
FIG. 6 is a cross-sectional view of the coolant reservoir of FIG. 5.

FIG. 6 is a cross-sectional view of the coolant reservoir 310 of FIG. 5. As discussed above, the body portion 410 is formed by side wall 412, top wall 420, and bottom wall 422 and defines an interior cavity 426. Coolant from the cooling system 100 enters the coolant reservoir 310 through the system inlet 430 as indicated by arrow 432 and exits the coolant reservoir 110 through system outlet 450 as indicated by arrow 452. Coolant may also be introduced into the coolant reservoir 310 through the fill inlet 470.

The coolant reservoir 310 further includes a barrier wall 480 that subdivides or partitions the interior cavity 426 into an upper chamber 482 and a lower chamber 484. The barrier wall 480 defines a barrier opening 486 that allows fluid communication between the upper chamber 482 and the lower chamber 484. The barrier wall 480 may be curved such that an outer edge 494 is vertically below an inner edge 496.

The system inlet 430 delivers coolant to the lower chamber 484 and the system outlet 450 removes coolant from the lower chamber 484 as the coolant circulates through the cooling system 100. The upper chamber 482 defines a space that enables expansion and contraction of coolant, as well as a space for collecting air within the cooling system 100. System coolant 488 is stored in the lower chamber 484, while reserve coolant 490 and collected air 492 are stored in the upper chamber 482.

Similar to the operation of the coolant reservoir 110 of FIGS. 2-4, coolant may flow between the upper chamber 282 and the lower chamber 284 through the barrier opening 286 to accommodate expansion and contraction. The coolant reservoir 310 of FIGS. 5 and 6 receives coolant within the lower chamber 484 from the system inlet 430 as system coolant 488. Any air mixed with the system coolant 488 may rise to the barrier wall 480 and flow through the barrier opening 486 to the upper chamber 482. The air then generally collects at the top of the coolant reservoir 310 as a portion of the collected air 492, as indicated by arrow 434. Accordingly, air mixed with the coolant from the system inlet 430 is removed from the system coolant 488, and as a result, the coolant removed from the coolant reservoir 310 from the system outlet 450 is deaerated coolant. After the air is collected in the upper chamber 482, the barrier wall 480 prevents the collected air 492 from being remixed with the system coolant 488, thereby preventing the collected air 492 from reentering the circuit of the cooling system 100.

Accordingly, exemplary embodiments provide coolant reservoirs 110 and 310 for deaeration and for storing reserve coolant in a single unit. Adequate deaeration enables a more efficient use of the coolant within the cooling system 100, thereby minimizing the volume and weight of the coolant. Benefits of the cooling system 100 discussed herein include the elimination of the need for a separate deaerator, thereby reducing cost burden, mass, and packaging space. The cooling system 100 also enables efficient air separation in a compact and light weight manner, thereby improving performance and heat dissipation. Although the cooling system 100 and coolant reservoirs 110 and 310 refer to the removal of air from the coolant, such air is not limited to atmospheric air. The coolant reservoirs 110 and 310 may be any type of gas, including hydrogen. Although the cooling system 100 is discussed above with respect to vehicles with electric motors, the cooling system 100 may also be used with internal combustion vehicle and any system that requires cooling.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A coolant reservoir, comprising:
    a body portion defining an interior cavity configured to hold a coolant, the body portion being generally box shaped with four side walls, a top wall, and a bottom wall;
    a barrier wall positioned within the body portion to partition the interior cavity into an upper chamber and a lower chamber, the barrier wall defining an opening therethrough that allows fluid communication between the lower chamber and the upper chamber;
    a first inlet conduit coupled to the body portion, on a first side wall of the side walls below the barrier wall, and configured to deliver a mixture of a first portion of the coolant and air to the lower chamber, wherein the barrier wall and the opening are configured to direct the air from the lower chamber to the upper chamber, wherein the first side wall forms a ramp extending inwardly into the interior cavity from a first position at the first inlet conduit to a second position at the bottom wall;
    a second inlet conduit coupled to the body portion on the top wall and configured to deliver a second portion of the coolant to the upper chamber; and
    a mounting flange extending around least two of the side walls, the top wall, and the bottom wall.

2. The coolant reservoir of claim 1, wherein the inlet conduit and the barrier wall are generally horizontal.

3. The coolant reservoir of claim 1, wherein the barrier wall has a tapered thickness.

4. The coolant reservoir of claim 1, wherein the barrier wall further includes at least one barrier slit adjacent to the body portion that allows fluid communication between the lower chamber and the upper chamber.

5. The coolant reservoir of claim 1, further comprising an outlet conduit coupled to the body portion and configured to draw coolant from the lower chamber.

6. The coolant reservoir of claim 5, wherein the outlet conduit is vertical.

7. The coolant reservoir of claim 5, wherein the outlet conduit is generally perpendicular to the barrier wall.

8. The coolant reservoir of claim 1, wherein the barrier wall and the opening are configured to accommodate coolant volume variations such that the coolant flows from the lower chamber, through the opening, and into the upper chamber during volume increases and the coolant flows from the upper chamber, through the opening, and into the lower chamber during volume decreases.

9. A cooling system for cooling a vehicle component with a coolant, comprising:
    a pump configured to direct the coolant to the vehicle component such that heat transfers from the vehicle component to the coolant;
    a heat exchanger fluidly coupled to the pump to remove heat from the coolant; and a coolant reservoir fluidly coupled to the heat exchanger and the pump, the coolant reservoir configured to receive a mixture of the coolant and entrained air, to store a first portion of the coolant as system coolant and a second portion of the coolant as reserve coolant, and to separate the entrained air from the system coolant, wherein the coolant reservoir comprises:

a body portion defining an interior cavity, the body portion being generally box shaped with four side walls, a top wall, and a bottom wall;

a barrier wall positioned within the body portion to partition the interior cavity into an upper chamber and a lower chamber, the upper chamber configured to store the reserve coolant and the lower chamber configured to store the system coolant;

an opening defined in the barrier wall to allow fluid communication between the lower chamber and the upper chamber;

a first inlet conduit coupled to the body portion, on a first side wall of the side walls below the barrier wall,. and configured to deliver a mixture of a first portion of the coolant and air to the lower chamber, wherein the barrier wall and the opening are configured to direct the air from the lower chamber to the upper chamber, wherein the first side wall forms a ramp extending inwardly into the interior cavity from a first position at the first inlet conduit to a second position at the bottom wall;

a second inlet conduit coupled to the body portion on the top wall and configured to deliver a second portion of the coolant to the upper chamber; and a mounting flange extending around least two of the side walls, the top wall, and the bottom wall.

10. The cooling system of claim 9, wherein the inlet conduit and the barrier wall are generally horizontal.

11. The cooling system of claim 9, wherein the barrier wall has a tapered thickness.

12. The cooling system of claim 9, wherein the coolant reservoir further comprises an outlet conduit coupled to the body portion and configured to draw coolant from the lower chamber.

13. A coolant reservoir, comprising:

a body portion defining an interior cavity configured to hold a coolant, the body portion being generally box shaped with four side walls, a top wall, and a bottom wall;

a barrier wall positioned within the body portion to partition the interior cavity into an upper chamber and a lower chamber;

an opening defined in the barrier wall to allow fluid communication between the lower chamber and the upper chamber, the barrier wall and the opening being configured to accommodate coolant volume variations such that the coolant flows from the lower chamber, through the opening, and into the upper chamber during volume increases and the coolant flows from the upper chamber, through the opening, and into the lower chamber during volume decreases;

a first inlet conduit coupled to the body portion on a first side wall of the side walls and configured to deliver a first portion of coolant to the lower chamber, the first inlet conduit is configured to deliver a mixture of the first portion of the coolant and air to the lower chamber, and the barrier wall and the opening being configured to direct the air from the lower chamber to the upper chamber, wherein the first side wall forms a ramp extending inwardly into the interior cavity from a first position at the first inlet conduit to a second position at the bottom wall;

a second inlet conduit coupled to the body portion on the top wall and configured to deliver a second portion of the coolant to the upper chamber; and a mounting flange extending around least two of the side walls, the top wall, and the bottom wall.

* * * * *